United States Patent [19]

Mosley et al.

[11] 4,238,739
[45] Dec. 9, 1980

[54] PRESET NETWORK FOR A PHASE LOCK LOOP

[75] Inventors: William H. Mosley, St. Petersburg; Carl F. Andren, Indiatlantic; Lex Scott, St. Petersburg, all of Fla.

[73] Assignee: E-Systems, Inc., Dallas, Tex.

[21] Appl. No.: 15,233

[22] Filed: Feb. 26, 1979

[51] Int. Cl.³ .............................................. H03L 7/10
[52] U.S. Cl. ........................................ 331/12; 329/50; 329/122; 331/25
[58] Field of Search .................................. 331/10–12, 331/25; 329/50, 122, 124; 325/419, 420, 423; 455/258, 260

[56] References Cited

U.S. PATENT DOCUMENTS

| | | | |
|---|---|---|---|
| 3,101,448 | 8/1963 | Costas | 329/50 |
| 3,384,824 | 5/1968 | Grenier | 325/49 |
| 3,458,823 | 7/1969 | Nordahl | 331/11 X |
| 3,675,131 | 7/1972 | Pickholtz | 325/329 |
| 3,745,255 | 7/1973 | Fletcher et al. | 329/122 X |
| 3,768,030 | 10/1973 | Brown et al. | 331/12 |
| 3,787,775 | 1/1974 | Lanning | 329/122 |
| 3,806,815 | 4/1974 | Fletcher et al. | 325/320 |
| 4,011,438 | 3/1977 | Aufderheide et al. | 235/152 |
| 4,021,743 | 5/1977 | Claxton | 329/103 |
| 4,027,265 | 5/1977 | Kobayashi et al. | 329/122 |
| 4,069,462 | 1/1978 | Dunn | 331/11 |

Primary Examiner—Siegfried H. Grimm
Attorney, Agent, or Firm—Albert M. Crowder, Jr.; Robert V. Wilder

[57] ABSTRACT

A phase lock loop (10) includes a frequency and phase preset network for presetting a local oscillator (20) in substantial synchronism with a carrier signal. The preset network utilizes time delayed output signals from split or double correlators (32, 34, 36, 38) to determine a change in the phase angle between the local oscillator signal and the carrier signal for a known time period to determine the frequency of the local oscillator signal relative to the carrier signal frequency. The preset network determines the phase of the local oscillator signal relative to the carrier signal phase utilizing the summed output of one split correlator (32 and 34) and of another split correlator (36 and 38).

10 Claims, 1 Drawing Figure

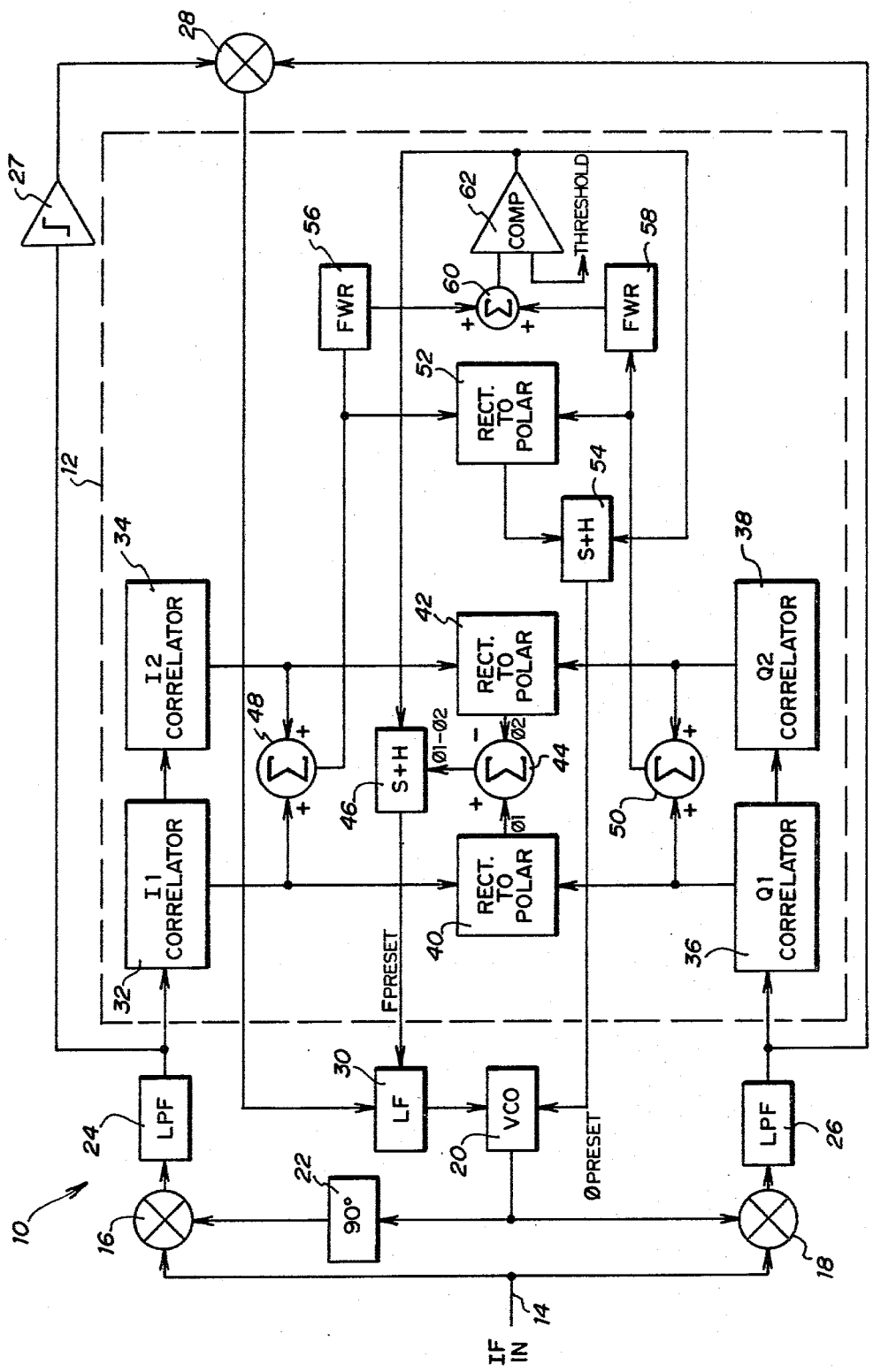

PRESET NETWORK FOR A PHASE LOCK LOOP

FIELD OF INVENTION

The present invention relates to a phase lock loop circuit, and particularly relates to a preset network for a phase lock loop circuit for presetting a local oscillator at a frequency and phase corresponding to the frequency and phase of a carrier signal.

BACKGROUND ART

In many communication systems, a local oscillator is used to demodulate an input signal to remove a carrier signal. In such conventional communication systems, a feedback loop, such as a Costas loop, may be used to control the frequency and the phase of the local oscillator. The feedback loop synchronizes the local oscillator and the carrier signal, such that the signal generated by the local oscillator may be mixed with the input signal to suppress the carrier signal leaving only the information portion of the signal. Most phase lock loops, such as the Costas loop, require a predetermined time period in which to latch or lock onto the carrier frequency, so that the local oscillator is controlled to suppress the carrier signal within a predetermined performance criteria.

High speed modems utilized in time division multiple access systems require rapid acquisition of the carrier frequency and phase, in addition to rapid acquisition of the bit timing and the data timing. In conventional communication systems, these four required pieces of information are often derived in a sequential fashion. This sequential operation requires the use of an excessive percentage of the allotted signal burst length in a multiple access system.

In a conventional coherent, carrier demodulation phase lock loop operating with bi-phase shift keyed modulation, the incoming signal is an intermediate frequency (IF) derived by down converting the incoming radio frequency signals to a standard frequency of, for example, seventy megahertz. This signal is mixed with the output from a Voltage Control Oscillator (VCO) or its digital counterpart, a Number Controlled Oscillator (NCO). The VCO or NCO output is at the center frequency of the incoming IF signal and is utilized to mix the incoming signal down to base band in two mixers known as the in-phase mixer and the quadrature phase mixer. The in-phase mixer is driven from the VCO (or NCO) through a 90° phase shifter. When carrier lock is achieved, the VCO (or NCO) output and the IF input will be in-phase so that the VCO (or NCO) signal received at the in-phase channel mixer is in phase with the carrier signal. The output of the in-phase mixer is low pass filtered and becomes the data output.

The quadrature mixture operates in phase quadrature with incoming signals to produce an output at base band that has nominal zero DC value and is utilized to tune the VCO (or NCO) in a null seeking loop. In a standard Costas loop the in-phase channel output is limited and multiplied with the quadrature channel output to produce a loop control voltage.

To determine bit timing and data timing, it is necessary to detect a code word in the input signal which is used as a preamble to the time division multiple access signal burst. In the prior art, a transversal correlator performed a matched filter detection of the code word in both the in-phase and quadrature phase channels. The correlator outputs are normally full wave rectified and summed to provide a trigger pulse to start the bit and word timing circuits. In such prior art systems, there existed a statistical probability of failure of the Costas carrier recovery loop to lock on the carrier signal and settle in the required period of time after the code signal was detected to initiate data recovery. Thus, a need has arisen for a communication system in which the recovery loop rapidly settles to lock the local oscillator in synchronism with the carrier signal.

DISCLOSURE OF INVENTION

The present invention provides a preset network for use in a phase lock loop circuit having an input for receiving a carrier signal and a data signal. A local oscillator generates a local oscillator signal that has a frequency corresponding to the carrier signal frequency, and a feedback loop is responsive to signals from the input and from the local oscillator to generate a control signal to synchronize the local oscillator in frequency and phase with the carrier signal.

The preset network includes a frequency monitor for detecting the frequency of the local oscillator signal relative to the frequency of the carrier signal and generates a frequency preset control signal corresponding to the frequency of the local oscillator signal relative to the carrier signal. A frequency preset control device presets the local oscillator to generate the local oscillator signal at a frequency corresponding to the frequency preset control signal.

A phase monitor also monitors the phase of the local oscillator signal relative to the carrier signal and generates a phase preset control signal corresponding to the phase of the local oscillator signal relative to the carrier signal. A phase preset control device presets the local oscillator to generate the local oscillator signal at a phase corresponding to the phase preset control signal.

With the phase monitor and frequency monitor, the preset network is operable to preset the local oscillator at a frequency and phase in substantial synchronism with the carrier signal. Since the local oscillator is preset in substantial synchronism with the carrier signal, the feedback loop will quickly acquire and settle on the carrier frequency signal.

In accordance with a more particular embodiment of the present invention, a preset network is used in a phase lock loop circuit. The phase lock loop circuit includes an input for receiving an input signal which includes a carrier signal and a plurality of time sequential data signals. The data signals include a code signal to indicate the beginning of each data signal. A local oscillator generates a local signal having a frequency corresponding to the frequency of the carrier, and an in-phase mixer mixes the input signal with the local oscillator signal phase shifted 90° in the in-phase channel. A quadrature phase mixer mixes the input signal and the local signal in the quadrature phase channel. A feedback loop is responsive to the signals from the in-phase mixer and from the quadrature phase mixer to generate a control signal for synchronizing the local oscillator in frequency and phase with the carrier signal.

The preset network includes an in-phase monitor for receiving a signal from the in-phase mixer, for generating in-phase monitoring signals and for generating a first recognition signal in response to receiving the code signal. Likewise, the quadrature phase monitor receives a signal from the quadrature phase mixer, generates quadrature phase monitoring signals and generates a second recognition signal in response to receiving the code signal. A phase determiner receives the in-phase monitoring signal and the quadrature phase monitoring signal and generates a phase preset signal corresponding to the phase of the local oscillator signal relative to the carrier signal. A frequency determiner receives the in-phase monitoring signal and the quadrature phase monitoring signal and generates a frequency preset signal corresponding to the frequency of the local oscillator signal relative to the carrier signal.

A trigger generator provides a trigger signal in response to the first and second recognition signals, and a phase preset control device is responsive to the trigger signal to preset the phase of the local oscillator to correspond to the phase preset signal, whereby the phase of the local oscillator is preset upon recognition of the code signal. A frequency preset control device is responsive to the trigger signal and presets the frequency of the local oscillator to correspond to the frequency preset signal, whereby the frequency of the local oscillator is preset upon recognition of the code signal.

The in-phase monitor is an in-phase split transversal correlator that receives signals from the in-phase mixer and includes two terminals for sampling the in-phase correlator at two distinct points to provide first and second in-phase correlator signals. The in-phase monitor also includes an in-phase sum device for combining the first and second in-phase correlator signals to generate an in-phase sum signal. Likewise, the quadrature phase monitor is a quadrature phase split transversal correlator for receiving signals from the quadrature phase mixer and having two terminals for sampling the quadrature phase correlator at two distinct points to provide first and second quadrature phase correlator signals. The quadrature phase monitor also includes a quadrature phase sum device for combining the first and second quadrature phase correlator signals to generate a quadrature phase sum signal.

The frequency determiner includes a first rectangular-to-polar converter, a second rectangular-to-polar converter and a subtraction device. The first rectangular-to-polar converter produces a first phase signal in response to the first in-phase correlator signal and the first quadrature phase correlator signal. The second rectangular to polar converter produces a second phase signal in response to the second in-phase correlator signal and the second quadrature phase correlator signal. The subtraction device subtracts the second phase signal from the first phase signal to produce a frequency preset signal corresponding to the frequency of the local oscillator relative to the carrier signal.

The phase determiner includes a rectangular-to-polar converter for producing a phase preset signal in response to the in-phase sum signal and the quadrature phase sum signal.

BRIEF DESCRIPTION OF DRAWINGS

The invention may best be understood by reference to the following Detailed Description when considered in conjunction with the accompanying Drawing in which a phase lock loop circuit is diagrammed having a preset network for presetting a local oscillator in synchronism with a carrier signal.

DETAILED DESCRIPTION

A circuit 10 shown in the Drawing is an embodiment of the present invention and represents a coherent carrier demodulation phase lock loop operating with Biphase Phase Shift Keyed modulation (BPSK). It will be understood that the invention may also be used with Quadraphase Phase Shift Keyed modulation (QPSK). That portion of circuit 10 lying outside of the dotted line 12 includes the elements of a conventional Costas loop. An input line 14 receives an input signal consisting of a carrier signal and a plurality of time sequential data signals. The data signals include a code signal or code word that identifies the beginning of each data signal and is used to determine bit timing and data timing as will be hereinafter described in more detail.

The input signal received at input line 14 is applied to an in-phase mixer 16 and a quadrature phase mixer 18. A local voltage controlled oscillator 20 generates a local oscillator signal that is applied directly to the quadrature phase mixer 18 and is multiplied therein by the input signal. The local oscillator signal is also applied through a 90° phase shifter 22 to the in-phase mixer 16 where the 90° phase shifted local oscillator signal is multiplied by the input signal.

The output of the in-phase mixer 16 is applied to a low pass filter 24, and likewise, the output of the quadrature phase mixer 18 is applied to a low pass filter 26. When the local oscillator signal of the voltage controlled oscillator 20 is synchronized with the carrier signal component of the input signal, the carrier signal is removed by the in-phase mixer 16, so that the output signal of the low pass filter 24 is demodulated base band data. The signal path following the in-phase mixer 16 is commonly referred to as the I channel, and the signal path following the quadrature phase mixer 18 is commonly referred to as the Q channel. The output of the low pass filter 24 in the I channel is applied through a limiter 27 to a mixer 28, and the output of the low pass filter 26 in the Q channel is applied directly to the mixer 28. The limiter 27 produces a +1 or −1 signal corresponding to the phase of the output signal of the low pass filter 24 to indicate only phase information of the I channel. Thus, the output of the low pass filter 26 is multiplied by either a +1 or a −1 and is applied through a loop filter 30 to the voltage controlled oscillator 20 to adjust or control the frequency of the oscillator 20. The Costas loop as described above maintains the local voltage controlled oscillator 20 in synchronism with the carrier signal in a conventional and well known manner.

A portion of the circuit within dotted line 12 monitors the frequency of the local voltage controlled oscillator 20 relative to the carrier signal. This circuit portion includes a pair of I channel correlators 32 and 34, a pair of Q channel correlators 36 and 38, a pair of rectangular to polar converters 40 and 42, a subtracter 44 and a sample and hold 46. The pair of correlators 32 and 34 are connected in series, and correlator 32 is connected to the low pass filter 24. Likewise, the pair of correlators 36 and 38 are connected in series, and correlator 36 is connected to the low pass filter 26. The correlators 32, 34, 36 and 38 are designed to detect or recognize the code signal and generate a recognition signal in response thereto. For this recognition function of the correlator pair 32 and 34 and the correlator pair 36 and 38, each pair functions as a single correlator to generate the recognition signal. However, two correlators, such as correlators 32 and 34, are utilized to provide a time delay function used in determining phase and frequency information as will hereinafter be described in more detail. Reticon Model No. R5401 correlators are suitable for use in an analog embodiment of the present invention, while TRW Model No. TDC1004J correlators are suitable for use in a digital embodiment.

The output of correlators 32 and 36 is connected to a first rectangular to polar converter 40 and the outputs of correlators 34 and 38 are connected to a second rectangular to polar converter 42. If the local signal of the local oscillator 20 is out of phase with the carrier signal, the outputs of the correlators 32 and 34 will provide the rectangular real component of the phase vector of the local oscillator signal relative to the carrier signal. The outputs of correlators 36 and 38 are phase shifted 90° and will provide the imaginary rectangular components of the phase vector of the local oscillator signal relative to the carrier signal. Thus, the outputs of the rectangular to polar converters 40 and 42 will correspond to the phase angle between the local oscillator signal and the carrier signal.

Since the data signals from the low pass filter 24 must travel through the I channel correlator 32 before it reaches the I channel correlator 34, the output signal of correlator 34 is time delayed with respect to the output signal of the correlator 32. Likewise, the output signal of the correlator 38 in the Q channel is time delayed with respect to the output signal of the correlator 36. Thus, the outputs of the rectangular to polar converters 40 and 42 represent the phase angle of the local oscillator signal relative to the carrier signal at two different points in time. The outputs of the rectangular to polar converters 40 and 42 are subtracted in the subtracter 44, and the output of the subtracter 44 corresponds to a change in the phase angle between the local oscillator signal and the carrier signal occurring in a known time period. This change in phase angle and, therefore, the output of subtracter 44 indicates the frequency of the local oscillator signal relative to the carrier signal.

In operation, the correlators 32 and 34 may be a single correlator tapped at two different points to provide the necessary time delay. Likewise, correlators 36 and 38 may also be a single correlator. Thus, correlators 32 and 34 and correlators 36 and 38 symbolically represent split correlators having two separate terminals. For proper operation, the correlators 32, 34, 36 and 38 must be chosen to provide a time delay that allows a phase shift of less than 180° due to the frequency difference between the incoming signal and the local oscillator.

The output of the subtracter 44 is applied to the sample and hold 46, and the output of the sample and hold 46 is selectively applied to the loop filter 30 as a bias voltage. In this manner, the output of the sample and hold 46 presets the local voltage control oscillator 20 through the loop filter 30 to a frequency corresponding to the carrier signal frequency. The sample and hold 46 samples the subtracter 44 when triggered by a trigger signal as will hereinafter be described in more detail.

A pair of summers 48 and 50 are connected between the correlators 32 and 34 and between the correlators 36 and 38. The outputs of these summers 48 and 50 are used to generate a trigger signal upon reception of the code signal and to preset the phase of the local signal generated by the local oscillator 20. The summer 48 adds the outputs of correlators 32 and 34, and the output of the summer 48 is applied to a rectangular to polar converter 52. Likewise, the summer 50 adds the output signals of correlators 36 and 38, and the output signal of the summer 50 is applied to another input of the rectangular to polar converter 52. The summed outputs of correlators 32 and 34 may be considered as the real rectangular component of the average phase angle vector between the local oscillator signal and the carrier signal, and the sum of the outputs of correlators 36 and 38 may be considered to be the imaginary rectangular component of the average phase angle vector of the local oscillator signal relative to the carrier signal. Thus, the output of the rectangular to polar converter 52 corresponds to the phase angle between the local oscillator signal and the carrier signal and is applied to a sample and hold 54. Upon the receipt of a trigger signal, the sample and hold 54 will sample the output of the rectangular to polar converter 52 and apply an output signal to the local voltage controlled oscillator 20 to preset the local oscillator 20 to generate a local signal corresponding in phase to the carrier signal.

The outputs of summers 48 and 50 are also applied through full wave rectifiers 56 and 58, respectively, to a summer 60. The summer 60 output signal is applied to a comparator 62 that compares this output signal with a threshold value. When the correlators 32, 34, 36 and 38 detect or recognize the code signal indicating the beginning of a data signal, recognition signals are generated at the outputs of the correlators having a greater power level than the signals at the outputs of the correlators when the code signal is not present. The recognition signals are transmitted through summers 48 and 50, full wave rectifiers 56 and 58 and summer 60 to provide a signal at comparator 62 that exceeds the threshold level. In response, the comparator 62 generates a trigger signal that is applied to the sample and hold 46 causing a sampling of the subtractor 44 and an application of a frequency preset signal to the loop filter 30 to preset the frequency of the local signal of the local oscillator 20. Likewise, the trigger signal of comparator 62 is applied to trigger the sample and hold 54 to sample the rectangular to polar converter 52 and to apply a phase preset signal to the local voltage controlled oscillator 20 to preset the phase of the local signal of oscillator 20. In this manner, the local oscillator 20 is preset to generate a local signal at a phase and frequency that is synchronized with the carrier signal.

Although a particular embodiment of the present invention has been described in the foregoing Detailed Description, it will be understood that numerous rearrangements, modifications and substitutions of parts can be made without departing from the spirit of the invention. Although the invention has been described with respect to an analog embodiment, it will be understood that the invention is also capable of digital implementation. In such case, a number controlled oscillator would be substituted for the voltage controlled oscillator 20 described above.

We claim:

1. A preset network for use in a phase lock loop circuit that receives an input signal including a carrier signal and a plurality of time sequential data signals, the data signals including a code signal to indicate the beginning of each data signal, a local oscillator for generating a local oscillator signal having a frequency corresponding to the frequency of the carrier signal, an in-phase mixer means for mixing the input signal with the local signal phase shifted 90° to produce base band data signals, quadrature phase mixer means for mixing the input signal and the local signal and feedback loop means responsive to signals from the in-phase mixer means and the quadrature phase mixer means for generating a control signal for the local oscillator to synchronize the local signal in frequency and phase with the carrier signal, the preset network comprising:

in-phase monitoring means connected to receive base band data signals from the in-phase mixer means for generating in-phase monitoring signals and for generating a first recognition signal in response to receiving the code signal;

quadrature phase monitoring means connected to receive signals from the quadrature phase mixer means for generating quadrature phase monitoring signals and for generating a second recognition signal in response to receiving the code signal;

frequency determining means for receiving the in-phase monitoring signals and the quadrature phase monitoring signals and for generating a frequency preset signal corresponding to the frequency of the local oscillator signal relative to the carrier signal frequency;

trigger means for generating a trigger signal in response to the first and second recognition signals; and frequency preset control means responsive to said trigger signal and said frequency preset signal for presetting the local oscillator to generate the local oscillator signal having a frequency corresponding to the frequency preset signal, whereby the frequency of the local oscillator is preset upon recognition of the code signal.

2. The preset network of claim 1 further comprising:

phase determining means for receiving the in-phase monitoring signals and the quadrature phase monitoring signals and for generating a phase preset signal corresponding to the phase of the local oscillator signal relative to the carrier signal phase; and phase preset control means responsive to the trigger signal and the phase preset signal for presetting the local oscillator to generate the local oscillator signal having a phase corresponding to the phase preset signal, whereby the phase of the local oscillator is preset upon recognition of the code signal.

3. The preset network of claim 2 wherein:

said in-phase monitoring means comprises an in-phase split transversal correlator for receiving signals from the in-phase mixer means, said in-phase correlator having two terminals for sampling said in-phase correlator at two distinct points to provide first and second in-phase correlator signals, and an in-phase sum means for combining the first and second correlator signals to generate an in-phase sum signal;

said quadrature phase monitoring means comprising a quadrature split transversal correlator for receiving signals from the quadrature phase mixer means, said quadrature phase correlator having two terminals for sampling said quadrature phase correlator at two distinct points to provide first and second quadrature phase correlator signals, and a quadrature phase sum means for combining the first and second quadrature phase correlator signals to produce a quadrature phase sum signal;

said frequency determining means being operable to produce said frequency preset signal in response to said first and second in-phase correlator signals and said first and second quadrature phase correlator signals; and said phase determining means being operable to produce said phase preset signal in response to said in-phase sum signal and said quadrature phase sum signal.

4. The preset network of claim 3 wherein said frequency determining means comprises:

a first rectangular to polar converter for producing a first phase signal in response to the first in-phase correlator signal and the first quadrature phase correlator signal;

a second rectangular to polar converter for producing a second phase signal in response to the second in-phase correlator signal and the second quadrature phase correlator signal; and subtraction means for subtracting the second phase signal from the first phase signal to produce the frequency preset signal corresponding to the frequency of the local oscillator relative to the carrier signal frequency.

5. The preset network of claim 3 wherein said phase determining means comprises a rectangular to polar converter for producing the phase preset signal in response to the in-phase sum signal and the quadrature phase sum signal.

6. A phase lock loop circuit including a preset network, comprising:

an input for receiving an input signal including a carrier signal and data signals, the data signals including code signals to indicate the beginning of each data signal;

a local oscillator for generating a local oscillator signal having a frequency corresponding to the frequency of the carrier signal;

a 90° phase shifter connected to the local oscillator for producing a local oscillator signal phase shifted 90°;

an in-phase mixer means for mixing the input signal with the local oscillator signal phase shifted 90°;

quadrature phase mixer means for mixing the input signal and the local oscillator signal;

feedback loop means responsive to signals from said in-phase mixer means and from said quadrature phase mixer means for generating a control signal to synchronize said local oscillator in frequency and phase with the carrier signal;

an in-phase split transversal correlator for receiving signals from said in-phase mixer means and generating first recognition signals in response to the code signals, said in-phase correlator having two terminals for sampling said in-phase correlator at two distinct points to provide first and second in-phase correlator signals with the second in-phase correlator signal time delayed with respect to the first in-phase correlator signal;

an in-phase sum means for adding the first and second in-phase correlator signals to produce an in-phase sum signal;

a quadrature phase split transversal correlator for receiving signals from the quadrature phase mixer means and generating second recognition signals in response to the code signals, said quadrature phase correlator having two terminals for sampling said quadrature phase correlator at two distinct points to provide first and second quadrature phase correlator signals with the second quadrature phase correlator signal time delayed with respect to the first quadrature phase correlator signal;

a quadrature phase sum means for combining the first and second quadrature phase correlator signals to produce a quadrature phase sum signal;

frequency determining means for producing a frequency preset signal in response to the first and second in-phase correlator signals and the first and second quadrature phase correlator signals, said frequency preset signal corresponding to the frequency of the local oscillator signal relative to the carrier signal frequency;

phase determining means for producing a phase preset signal in response to the in-phase sum signal and the quadrature phase sum signal;

trigger means responsive to the in-phase sum signal and the quadrature phase sum signal to generate a trigger signal when said in-phase and quadrature phase correlators receive the code signals and generate the first and second recognition signals;

phase preset control means responsive to the trigger signal and the phase preset signal for presetting the phase of the local oscillator to correspond to the phase preset signal, whereby the phase of the local oscillator is preset upon recognition of the code signal; and frequency preset control means responsive to the trigger signal and the frequency preset signal for presetting the frequency of the local oscillator to correspond to the frequency preset signal, whereby the frequency of the local oscillator is preset upon recognition of the code signal.

7. The phase lock loop circuit as set forth in claim 6 wherein said frequency determining means comprises:

a first rectangular to polar converter for producing a first phase signal in response to the first in-phase correlator signal and the first quadrature phase correlator signal;

a second rectangular to polar converter for producing a second phase signal in response to the second in-phase correlator signal and the second quadrature phase correlator signal; and subtraction means for subtracting the second phase signal from the first phase signal to produce the frequency preset signal corresponding to the frequency of the local oscillator signal relative to the carrier signal frequency.

8. The phase lock loop circuit of claim 6 wherein said phase determining means comprises a rectangular to polar converter responsive to the in-phase sum signal and the quadrature phase sum signal for producing the phase preset signal corresponding to the phase of the local oscillator signal relative to the carrier signal.

9. A phase lock loop circuit including a preset network, comprising:

an input for receiving an input signal including a carrier signal and data signals and for splitting the input signal into an I channel and Q channel, said data signals including a code signal to indicate the beginning of each data signal;

a local oscillator for generating a local oscillator signal having a frequency corresponding to the frequency of the carrier signal;

a phase shifter for receiving the local oscillator signal and generating a 90° phase shifted local oscillator signal;

Q channel mixer means for mixing the input signal and the local oscillator signal to generate a Q channel mixed signal;

I channel mixer means connected to the phase shifter for mixing the input signal with the 90° phase shifted local oscillator signal to produce an I channel mixed signal;

a first low pass filter having an input for receiving the I channel mixed signal and having an output;

a second low pass filter having an input for receiving the Q channel mixed signal and having an output;

feedback loop means connected to the outputs of the first and second low pass filters for generating a control signal to synchronize the local oscillator in frequency and phase with the carrier signal;

an I channel split correlator having an input connected to the output of the first low pass filter for continuously producing first and second I channel correlator signals and for producing a recognition signal in response to receiving said code signal;

first and second I channel output terminals connected to said I channel correlator for receiving the first and second I channel correlator signals, respectively, said I channel terminals being connected to said I channel correlator at two points sufficiently separated to provide a time delay between said I channel output terminals;

a quadrature phase split correlator having an input connected to the output of said second low pass filter for continuously producing first and second Q channel correlator signals and for producing a recognition signal in response to receiving said code signal;

first and second Q channel output terminals connected to said Q channel correlator for receiving the first and second Q channel correlator signals, respectively, said Q channel terminals being connected to said Q channel correlator at two points sufficiently separated to provide a time delay between said Q channel output terminals;

a first rectangular to polar converter connected to said first I channel output terminal and said first Q channel output terminal for producing a first phase signal;

a second rectangular to polar converter connected to said second I channel output terminal and said second Q channel output terminal for producing a second phase signal;

subtraction means for subtracting said second phase signal from said first phase signal to produce a frequency preset signal corresponding to the frequency of said local oscillator signal relative to said carrier signal frequency;

a first sample and hold means for receiving the frequency preset signal and having an output connected to said feedback loop;

an in-phase sum means connected to the first and second I channel output terminals and having an output for transmitting an in-phase sum signal;

an I channel rectifier having an input connected to the output of said I channel sum means and having an output;

a Q channel sum means connected to said first and second Q channel output terminals and having an output for transmitting a Q channel sum signal;

a Q channel rectifier having an input connected to the output of the Q channel sum means and having an output;

a comparison means connected to the outputs of said I channel and Q channel rectifiers for comparing the combined output signals of said rectifiers to a preselected threshold to selectively generate a trigger signal, whereby a trigger signal is generated when the code signal is received by said I channel correlator and said Q channel correlator;

said first sample and hold means being responsive to said trigger signal to sample, hold and transmit said frequency preset signal to said feedback loop to preset said local oscillator at a frequency corresponding to the frequency of the carrier signal;

a third rectangular to polar converter connected to the outputs of said I channel sum means and said Q channel sum means for generating a phase preset signal;

a second sample and hold means for receiving the phase preset signal and having an output connected to said local oscillator; and said second sample means being responsive to the trigger signal to sample, hold and transmit the frequency preset signal to said local oscillator to preset said local oscillator at a phase corresponding to the phase of the carrier signal.

10. A preset network for use in a phase lock loop circuit that receives an input signal including a carrier signal and at least one data signal, a local oscillator for generating a local oscillator signal having a frequency corresponding to the carrier signal frequency and feedback loop means responsive to the input signal and the local oscillator signal for generating a control signal for the local oscillator to synchronize the local oscillator signal in frequency and phase with the carrier signal, the preset network comprising:

frequency monitoring means for detecting the frequency of the local oscillator signal relative to the carrier signal frequency and for generating a frequency preset signal corresponding to the frequency of the local oscillator signal relative to the carrier signal frequency;

frequency preset control means responsive to the frequency preset signal for presetting the local oscillator to generate the local oscillator signal at a frequency corresponding to the frequency preset signal, whereby the local oscillator signal is synchronized in frequency with the carrier signal;

phase monitoring means for monitoring the phase of the local oscillator signal relative to the carrier signal phase and for generating a phase preset signal corresponding to the phase of the local oscillator relative to the carrier signal phase; and phase preset control means responsive to the phase preset signal for presetting the local oscillator to generate the local oscillator signal at a phase corresponding to the phase preset signal, whereby the local oscillator signal is synchronized in phase with the carrier signal.

* * * * *